US010410576B2

(12) United States Patent
Choi (10) Patent No.: US 10,410,576 B2
(45) Date of Patent: Sep. 10, 2019

(54) DISPLAY DEVICE HAVING A LIGHT-EMITTING STRUCTURE

(71) Applicant: LG Display Co., Ltd., Seoul (KR)

(72) Inventor: Ho-Won Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 3 days.

(21) Appl. No.: 15/791,149

(22) Filed: Oct. 23, 2017

(65) Prior Publication Data
US 2018/0151108 A1 May 31, 2018

(30) Foreign Application Priority Data
Nov. 30, 2016 (KR) .................. 10-2016-0162334

(51) Int. Cl.
*G09G 3/32* (2016.01)
*G09G 3/20* (2006.01)
*H01L 51/52* (2006.01)
*H01L 27/32* (2006.01)

(52) U.S. Cl.
CPC ............ *G09G 3/32* (2013.01); *G09G 3/2074* (2013.01); *H01L 27/326* (2013.01); *H01L 27/3248* (2013.01); *H01L 51/5209* (2013.01); *G09G 2300/0452* (2013.01); *H01L 27/322* (2013.01); *H01L 27/3246* (2013.01); *H01L 51/5218* (2013.01); *H01L 51/5271* (2013.01); *H01L 2251/568* (2013.01)

(58) Field of Classification Search
CPC . G09G 3/32; G09G 3/2074; G09G 2300/0452
See application file for complete search history.

(56) References Cited

U.S. PATENT DOCUMENTS

| 2006/0011913 A1* | 1/2006 | Yamazaki ............ G06F 3/0412 257/59 |
| 2007/0236424 A1* | 10/2007 | Kimura ................ G09G 3/3233 345/76 |
| 2013/0234590 A1 | 9/2013 | Li et al. |
| 2014/0117339 A1 | 5/2014 | Seo |
| 2015/0364712 A1 | 12/2015 | Lee et al. |
| 2016/0226013 A1 | 8/2016 | Liu et al. |
| 2017/0133438 A1 | 5/2017 | Seo |

FOREIGN PATENT DOCUMENTS

| EP | 2 458 937 A1 | 5/2012 |
| TW | I596759 B | 8/2017 |

OTHER PUBLICATIONS

European Patent Office, Extended European Search Report and Opinion, EP Patent Application No. 17204320.0, dated Apr. 26, 2018, seven pages.
Taiwan Intellectual Property Office, First Office Action, TW Patent Application No. 106140164, dated Nov. 7, 2018, 12 pages.

* cited by examiner

*Primary Examiner* — Shaheda A Abdin
(74) *Attorney, Agent, or Firm* — Fenwick & West LLP (57) ABSTRACT

A display device including two light-emitting structures on a single sub-pixel area is provided. In the display device, the two light-emitting structures are inclined toward the center of the corresponding sub-pixel area.

20 Claims, 8 Drawing Sheets

DISPLAY DEVICE HAVING A LIGHT-EMITTING STRUCTURE

This application claims the priority benefit of Korean Patent Application No. 10-2016-0162334, filed on Nov. 30, 2016, which is hereby incorporated by reference as if fully set forth herein.

BACKGROUND

Field of the Invention

The present disclosure relates to a display device including a light-emitting structure, which generates a light realizing a specific color.

Discussion of the Related Art

Electronic appliances, such as monitors, TVs, laptop computers, and digital cameras, include a display device to realize an image. For example, the display device may include a liquid crystal display device or an organic light-emitting display device.

The display device may include sub-pixel areas. Adjacent sub-pixel areas may realize a different color to each other. For example, the display device may include a red sub-pixel area displaying red color, a blue sub-pixel area displaying blue color, a green sub-pixel area displaying green color, and a white sub-pixel area displaying white color.

A light-emitting structure generating light realizing a specific color may be disposed on each sub-pixel area of the display device. For example, the light-emitting structure may include a lower electrode, a light-emitting layer, and an upper electrode, which are sequentially stacked.

In the display device, the upper electrode of the light-emitting structure may be partially connected to the lower electrode due to a particle generated by forming process. For example, the method of fabricating the display device may include a repair process which is a process of removing a contact region between the lower electrode and the upper electrode of the light-emitting structure.

However, because a region removing the lower electrode and/or the upper electrode by the repair process functions as a dark spot, an emitting area of the display device may be decreased. More partially, in the high revolution display device which includes a relative small open area, the clarity of the color may be decreased by reducing the emitting area due to the dark spot.

SUMMARY

Accordingly, the present disclosure is directed to a display device having a light-emitting structure that substantially obviates one or more problems due to limitations and disadvantages of the related art.

One objective of the present disclosure is to provide a display device which may prevent that an emitting area is reduced by a repair process.

Another objective of the present disclosure is to provide a display device which may enough secure an emitting area regardless of a dark spot by a repair process.

Additional advantages, objectives, and features will be set forth in part in the description which follows and in part will become apparent to those having ordinary skill in the art upon examination of the following or may be learned from practice of the disclosed principles. The objectives and other advantages may be realized and attained by the structure particularly pointed out in the written description and claims hereof as well as the appended drawings.

To achieve these objectives and other advantages and in accordance with the purpose of the present disclosure, as embodied and broadly described herein, there is provided a display device including a lower substrate. The lower substrate includes a sub-pixel area for producing a specific color. A first light-emitting structure and a second light-emitting structure are disposed on the sub-pixel area of the lower substrate. The first light-emitting structure and the second light-emitting structure are inclined with respect to the lower substrate. The first light-emitting structure is defined by a sequential stack of a first lower electrode, a first light-emitting layer and a first upper electrode. The second light-emitting structure is defined by a sequential stack of a second lower electrode spaced apart from the first lower electrode, a second light-emitting layer and a second upper electrode. At least a portion of the second light-emitting structure is inclined in an opposite direction relative to at least a portion of the first light-emitting structure with respect to the sub-pixel area of the lower substrate.

A distance between the lower substrate and an upper surface of the first lower electrode decreases towards a center of the sub-pixel area, and a distance between the lower substrate and an upper surface of the second lower electrode may be decreased toward the center of the sub-pixel area.

A thin film transistor may be disposed between the lower substrate and the first light-emitting structure. The thin film transistor may include a drain electrode connected to the first lower electrode and the second lower electrode.

A lower passivation layer may be disposed on the thin film transistor. The lower passivation layer may cover the thin film transistor. The lower passivation layer may include a first contact hole and a second contact hole which respectively expose the drain electrode. The first lower electrode and the second lower electrode may be in direct contact with the lower passivation layer.

The second light-emitting layer may include a same material as the first light-emitting layer The second light-emitting layer may be connected to the first light-emitting layer. The second upper electrode may be connected to the first upper electrode.

A color filter may be disposed on the first light-emitting structure. The color filter may extend onto the second light-emitting structure.

A first bank insulating layer may cover one edge of the first lower electrode and a second bank insulating layer may cover another edge of the first lower electrode.

In accordance with another aspect of the present disclosure, there is provided a display device including a first inclined insulating layer on a lower substrate and a second inclined insulating layer on the lower substrate. The first inclined insulating layer includes a first inclined side which is positively tapered. The second inclined insulating layer includes a second inclined side which is positively tapered. The second inclined insulating layer is adjacent to the first inclined insulating layer. A first light-emitting structure is disposed on the first inclined side. The first light-emitting structure is defined by a sequential stack of a first lower electrode, a first light-emitting layer, and a first upper electrode. A second light-emitting structure is disposed on the second inclined side. The second light-emitting structure in conjunction with the first light-emitting structure forms a well. The second light-emitting structure is defined by a sequential stack of a second lower electrode spaced apart from the first light-emitting structure, a second light-emitting layer, and a second upper electrode. A color filter is disposed on the first light-emitting structure and the second light-emitting structure.

A width of the well decreases towards the lower substrate.

A black matrix may be disposed on an upper substrate opposite the lower substrate. The black matrix may be in contact with a side of a color filter above the well.

A side of the black matrix may be negatively tapered.

A vertical thickness of the black matrix may be larger than a vertical thickness of the color filter.

A reflective pattern may be disposed on a side of the black matrix.

The color filter may be in the well.

In accordance with another aspect of the present disclosure, there is provided a display device comprising a lower substrate including a sub-pixel area for producing a specific color, a thin film transistor on an upper surface of the lower substrate within the sub-pixel area, a first lower electrode, a second lower electrode, and a light emitting layer on the first lower electrode and the second lower electrode. The first lower electrode and the second lower electrode are coupled to a thin film transistor (TFT). The first lower electrode is slanted in a first direction with respect to the lower substrate and the second lower electrode is slanted in an opposite direction with respect to the lower substrate.

The upper surface of the first lower electrode and the upper surface of the second lower electrode may be symmetric.

The light emitting layer includes a first segment on the first lower electrode and slanted in the same direction as the first lower electrode, and a second segment on the second lower electrode and slanted in a same direction as the second lower electrode. The portion of the light-emitting layer closer to the center of the sub-pixel area is closer to the upper surface of the lower substrate than a portion of the light-emitting layer closer to an edge of the sub-pixel area.

In some embodiments, the display device further includes an insulator between the TFT and the first lower electrode. The first electrode is on an upper surface of the insulator. The upper surface of the insulator is slanted in the same direction as the first lower electrode.

The display device further includes a first bank insulating layer covering one edge of the first lower electrode and a second bank insulating layer covering another edge of the first lower electrode.

The first bank insulating layer may be closer to the upper surface of the lower substrate than the second bank insulating layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Hereinafter, details related to the above objectives, technical configurations, and operational effects of the embodiments of the present disclosure will be clearly understood by the following detailed description with reference to the drawings, which illustrate the various embodiments. Here, the various embodiments are provided in order to allow the technical sprit of the present disclosure to be satisfactorily transferred to those skilled in the art, and thus the present invention may be embodied in other forms and is not limited to the embodiments described below.

In addition, the same or similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

As used herein, an emission area refers to a total surface area of a light emitting structure that emits light.

Figure 1:
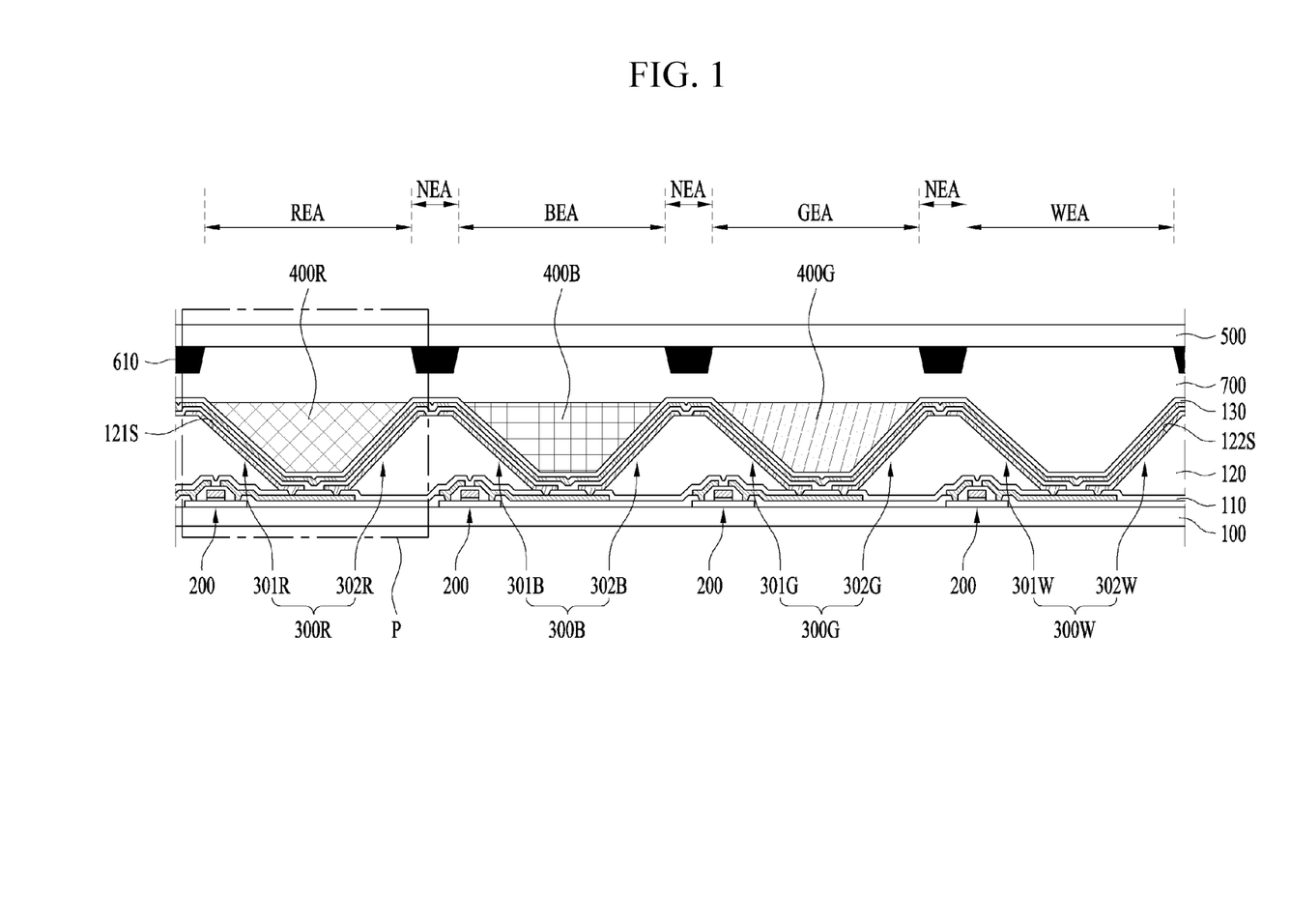
FIG. 1 is a view schematically showing a display device according to an embodiment.
Figure 2:
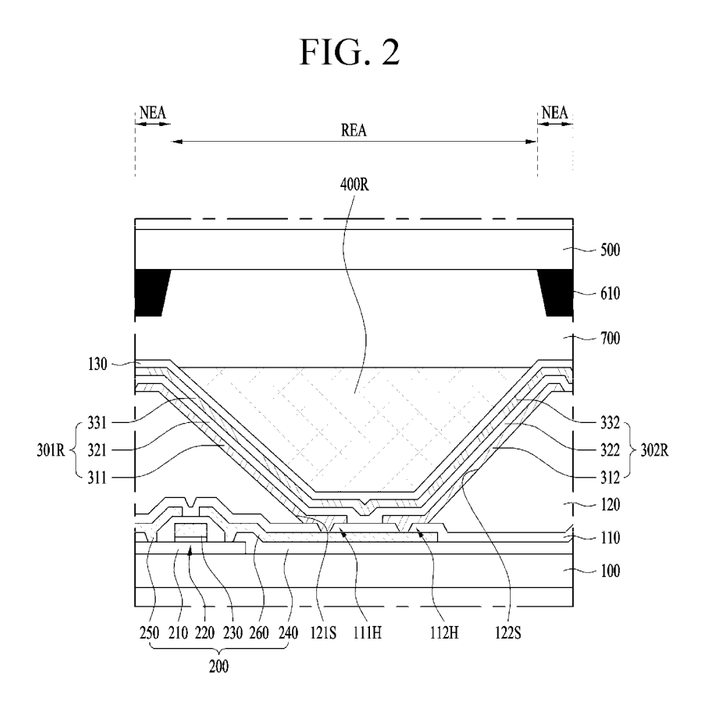
FIG. 2 is an enlarge view of region P in FIG. 1.

FIG. 1 is a view schematically showing a display device according to an embodiment. FIG. 2 is an enlarge view of region P which is a single sub-pixel area of the display device according to the embodiment of FIG. 1.

Referring to FIGS. 1 and 2, the display device comprises a lower substrate 100, thin film transistors 200, a lower passivation layer 110, inclined insulating layers 120, light-emitting structures 300R, 300B, 300G and 300W, and color filters 400R, 400B and 400G.

The lower substrate 100 may support the inclined insulating layers 120, the thin-film transistors 200, and the light-emitting structures 300R, 300B, 300G and 300W. The lower substrate 100 may include an insulating material. The lower substrate 100 may include a transparent material. For example, the lower substrate 100 may include glass or plastic.

The lower substrate 100 may include sub-pixel areas REA, BEA, GEA and WEA (collectively referred to as "emitting area"), and non-emitting areas NEA. The non-emitting areas NEA may be disposed between the sub-pixel areas REA, BEA, GEA and WEA. The sub-pixel areas REA, BEA, GEA and WEA may be separated by the non-emitting areas NEA.

The sub-pixel area REA, BEA, GEA and WEA of the lower substrate 100 may realize a different color to each other. For example, the lower substrate 100 may include a red sub-pixel area REA realizing red color, a blue sub-pixel area BEA realizing blue color, a green sub-pixel area GEA realizing green color, and a white sub-pixel area WEA realizing white color.

The thin film transistors 200 may be disposed on the lower substrate 100. For example, each of the thin film transistors 200 may include a semiconductor pattern 210, a gate insulating layer 220, a gate electrode 230, an interlayer insulating layer 240, a source electrode 250, and a drain electrode 260.

The semiconductor pattern 210 may be disposed close to the lower substrate 100. The semiconductor pattern 210 may include a semiconductor material. For example, the semiconductor pattern 210 may include amorphous silicon or polycrystalline silicon. The semiconductor pattern 210 may include an oxide semiconductor material. For example, the semiconductor pattern 210 may include IGZO.

The semiconductor pattern 210 may include a source region, a drain region, and a channel region. The channel region may be disposed between the source region and the drain region. The conductivity of the channel region may be smaller than that of the source region and that of the drain region. For example, the source region and the drain region may include a conductivity impurity.

The display device is described such that the lower substrate 100 is in direct contact with the semiconductor patterns 210 of the thin film transistors 200. However, the display device according to another embodiment may include a buffer layer between the lower substrate 100 and the thin film transistors 200. The buffer layer may include an insulating material. For example, the buffer layer may include silicon oxide.

The gate insulating layer 220 may be disposed on the semiconductor pattern 210. The gate insulating layer 220 may include an insulating material. For example, the gate insulating layer 220 may include silicon oxide and/or silicon nitride. The gate insulating layer 220 may include a high-K material. For example, the gate insulating layer 220 may include hafnium oxide (HfO) or titanium oxide (TiO). The gate insulating layer may be a multi-layer structure.

The gate electrode 230 may be disposed on the gate insulating layer 220. The gate electrode 230 may overlap the channel region of the semiconductor pattern 210. The gate electrode 230 may be insulated from the semiconductor pattern 210 by the gate insulating layer 220. For example, the gate insulating layer 220 may include a side vertically aligned with the gate electrode 230. The side of the gate insulating layer 220 may be continuous with a side of the gate electrode 230.

The gate electrode 230 may include a conductive material. For example, the gate electrode 230 may include a metal, such as aluminum (Al), chromium (Cr), molybdenum (Mo), and tungsten (W).

The interlayer insulating layer 240 may be disposed on the semiconductor pattern 210 and the gate electrode 230. The interlayer insulating layer 240 may extend to the outside of the semiconductor pattern 210. The semiconductor pattern 210 and the gate electrode 230 may be covered by the interlayer insulating layer 240.

The interlayer insulating layer 240 may include an insulating material. For example, the interlayer insulating layer 240 may include silicon oxide.

The source electrode 250 may be disposed on the interlayer insulating layer 240. The source electrode 250 may be electrically connected to the source area of the semiconductor pattern 210. For example, the interlayer insulating layer 240 may include a contact hole exposing the source area of the semiconductor pattern 210.

The source electrode 250 may include a conductive material. For example, the source electrode 250 may include a metal, such as aluminum (Al), chromium (Cr), molybdenum (Mo), titanium (Ti), copper (Cu) and tungsten (W). The source electrode 250 may be a multi-layer structure.

The drain electrode 260 may be disposed on the interlayer insulating layer 240. The drain electrode 260 may be spaced apart from the source electrode 250. The drain electrode 260 may be electrically connected to the drain area of the semiconductor pattern 210. For example, the interlayer insulating layer 240 may include a contact hole exposing the drain area of the semiconductor pattern 210.

The drain electrode 260 may include a conductive material. The drain electrode 260 may include a same material as the source electrode 250. For example, the drain electrode 260 may include a metal, such as aluminum (Al), chromium (Cr), molybdenum (Mo), titanium (Ti), copper (Cu) and tungsten (W). A structure of the drain electrode 260 may be same as a structure of the source electrode 250. For example, the drain electrode 260 may be a multi-layer structure.

The display device is described such that the semiconductor pattern 210 is disposed between the lower substrate 100 and the gate electrode 230 in each thin film transistor 200. However, the display device according to another embodiment may include the thin film transistor 200 in which the gate electrode 230 is disposed between the lower substrate 100 and the semiconductor pattern 210.

The lower passivation layer 110 may be disposed on the thin film transistors 200. The lower passivation layer 110 may extend to the outside of the source electrode 250 and the drain electrode 260. For example, the lower passivation layer 110 may be in direct contact with the interlayer insulating layer 240 on the outside of the source electrode 250 and the drain electrode 260 of the thin film transistor 200.

The lower passivation layer 110 may include an insulating material. For example, the lower passivation layer 110 may include silicon oxide and/or silicon nitride. The lower passivation layer 110 may be a multi-layer structure.

The lower passivation layer 110 may include a first contact hole 111H and a second contact hole 112H. The first contact hole 111H and the second contact hole 112H may overlap the drain electrode 260 of the thin film transistor 200. The second contact hole 112H may be spaced apart from the first contact hole 111H. The drain electrode 260 may include a first region exposed by the first hole 111H of the lower passivation layer 110, and a second region exposed by the second hole 112H of the lower passivation layer 110. The second region of the drain electrode 260 may be spaced apart from the first region of the drain electrode 260.

The inclined insulating layers 120 may be disposed on the lower passivation layer 110. The inclined insulating layers 120 may be spaced apart each other. For example, the first contact hole 111H and the second contact hole 112H of the lower passivation layer 110 may be disposed between the adjacent inclined insulating layers 120. The drain electrode 260 of the thin film transistor 200 may include a portion which is overlapped with the inclined insulating layers 120, and a portion which is not overlapped with the inclined insulating layer 120.

Each of the inclined insulating layers 120 may include a first inclined side 121S and a second inclined side 122S. The first inclined side 121S and the second inclined side 122S may be inclined with respect to the lower substrate 100. For example, the first inclined side 121S and the second inclined side 122S may be positively tapered. A horizontal distance of an upper surface of each of the inclined insulating layers 120 may be smaller than a horizontal distance of a lower surface of the corresponding inclined insulating layer 120. In some embodiments, one first inclined side and an adjacent second inclined side form a well.

The second inclined side 122S may be opposite to the first inclined side 121S. For example, the first inclined side 121S of each of the inclined insulating layers 120 may face the second inclined side 122S of the adjacent inclined insulating layer 120. For example, the second inclined sides 122S of the inclined insulating layers 120 may face the first inclined side 121S of the adjacent inclined insulating layer 120, respectively.

The upper surfaces of the inclined insulating layers 120 may overlap the non-emitting area NEA of the lower substrate 100. The first inclined side 121S and the second inclined side 122S of each of the inclined insulating layers 120 may extend onto the sub-pixel areas REA, BEA, GEA and WEA of the lower substrate 100. The first inclined side 121S and the second inclined side 122S of each of the inclined insulating layer 120 may overlap the sub-pixel areas REA, BEA, GEA and WEA of the lower substrate 100.

The adjacent inclined insulating layers 120 may be spaced apart at the center of the sub-pixel areas REA, BEA, GEA and WEA of the lower substrate 100. For example, a vertical distance between the lower substrate 100 and the first inclined side 121S and a vertical distance between the lower substrate 100 and the second inclined side 122S may be decreased toward the center of the corresponding sub-pixel area REA, BEA, GEA and WEA. The first contact hole 111H and the second contact hole 112H of the lower passivation layer 110 may be disposed close to the center of the sub-pixel areas REA, BEA, GEA and WEA.

The inclined insulating layers 120 may include an insulating material. For example, the inclined insulating layers 120 may include an organic insulating material. The inclined insulating layers 120 may include a curable material. For example, the inclined insulating layers 120 may include thermosetting resin.

The light-emitting structures 300R, 300B, 300G and 300W may be disposed on the sub-pixel areas REA, BEA, GEA and WEA of the lower substrate 100. Each of the light-emitting structure 300R, 300B, 300G and 300W may overlap the corresponding sub-pixel areas REA, BEA, GEA and WEA of the lower substrate 100. For example, the light-emitting structures 300R, 300B, 300G and 300W may include a red light-emitting structure 300R overlapping with the red sub-pixel area REA of the lower substrate 100, a blue light-emitting structure 300B overlapping with the blue sub-pixel area BEA of the lower substrate 100, a green light-emitting structure 300G overlapping with the green sub-pixel area GEA of the lower substrate 100, and a white light-emitting structure 300W overlapping with the white sub-pixel area WEA of the lower substrate 100.

The light-emitting structures 300R, 300B, 300G and 300W may be disposed on the first inclined side 121S and the second inclined side 122S of the inclined insulating layers 120. For example, each of the light-emitting structures 300R, 300B, 300G and 300W may include a first light-emitting structure 301R, 301B, 301G and 301W on the first inclined sides 121S of the inclined insulating layers 120 which overlaps the corresponding sub-pixel area REA, BEA, GEA and WEA, and a second light-emitting structure 302R, 302B, 302G and 302W on the second inclined sides 122S of the inclined insulating layers 120 which overlaps the corresponding sub-pixel area REA, BEA, GEA and WEA. The second light-emitting structure 302R, 302B, 302G and 302W of the light-emitting structure 300R, 300B, 300G and 300W may be disposed on the different inclined insulating layer 120 as the first light-emitting structure 301R, 301B, 301G and 301W of the corresponding light-emitting structure 300R, 300B, 300G and 300W. For example, a horizontal distance between the first light-emitting structure 301R, 301B, 301G and 301W and a second light-emitting structure 302R, 302B, 302G and 302W facing the first light-emitting structure 301R, 301B, 301G and 301W may be increased away from the lower substrate 100. In some embodiments, a first light-emitting structure and a second light-emitting structure in a sub-pixel area form a well.

The light-emitting structures 300R, 300B, 300G and 300W may generate a light for realizing a specific color, respectively. The first light-emitting structure 301R of the red light-emitting structure 300R may include a first lower electrode 311, a first light-emitting layer 321, and a first upper electrode 331, which are sequentially stacked. The first light-emitting structure 301B of the blue light-emitting structure 300B, the first light-emitting structure 301G of the green light-emitting structure 300G and the first light-emitting structure 301W of the white light-emitting structure 300W may have a same structure as the first light-emitting structure 301R of the red light-emitting structure 300R. The second light-emitting structure 302R of the red light-emitting structure 300R may include a second lower electrode 312, a second light-emitting layer 322, and a second upper electrode 332, which are sequentially stacked. The second light-emitting structure 302B of the blue light-emitting structure 300B, the second light-emitting structure 302G of the green light-emitting structure 300G and the second light-emitting structure 302W of the white light-emitting structure 300W may have a same structure as the second light-emitting structure 302R of the red light-emitting structure 300R.

In the display device, two light-emitting structures 300R, 300B, 300G and 300W inclined with respect to the lower substrate 100 in each sub-pixel area REA, BEA, GEA and WEA may be symmetrically disposed. Thus, in the display device, the light generated by the light-emitting structures 300R, 300B, 300G and 300W of each sub-pixel area REA, BEA, GEA and WEA may be focused. Therefore, in the display device, the visibility and the emission efficiency may be improved. Also, in the display device, because the light may be emitted in a diagonal direction with respect to the surface of the lower substrate 100 due to the light-emitting structures 300R, 300B, 300G and 300W which are slantingly located, the emission area may be increased.

The first light-emitting structure 301R, 301B, 301G and 301W and the second light-emitting structure 302R, 302B, 302G and 302W of each of the light-emitting structure 300R, 300B, 300G and 300W may be controlled by a thin film transistor 200 disposed in the corresponding sub-pixel area REA, BEA, GEA and WEA. For example, the first lower electrode 311 of the first light-emitting structure 301R and the second lower electrode 312 of the second light-emitting structure 302R of the red light-emitting structure 300R may be connected to the drain electrode 260 of the thin film transistor 200 disposed in the corresponding red sub-pixel area REA. The first lower electrode 311 of the red light-emitting structure 300R may be connected to the corresponding drain electrode 260 through the first contact hole 111H of the lower passivation layer 110. The second lower electrode 312 of the red light-emitting structure 300R may be connected to the corresponding drain electrode 260 through the second contact hole 112H of the lower passivation layer 110. The first lower electrode 311 and the second lower electrode 312 of the red light-emitting structure 300R may be in direct contact with the lower passivation layer 110.

The second lower electrode 312 of the second light-emitting structure 302R, 302B, 302G and 302W may be spaced apart from the first lower electrode 312 of the first light-emitting structure 301R, 301B, 301G and 301W. For example, the first lower electrode 311 and the second lower electrode 312 may be spaced apart between the first contact hole 111H and the second contact hole 112H. Thus, in the display device, when the first lower electrode 311 or the second lower electrode 312 become unusable by repair process, the emitting area of the corresponding sub-pixel area REA, BEA, GEA and WEA may be maintained by the light-emitting structure 300R, 300B, 300G and 300W including the usable lower electrode 311 or 312. Specifically, when one of the first lower electrode 311 or the second lower electrode 312 is cut off due to defects or a repair process, light generated by the usable light emitting structure may reflect from the unusable lower electrode 311 or 312, thus allowing the entire sub-pixel area to be lit by the usable light emitting structure.

The first lower electrode 311 and the second lower electrode 312 may include a conductive material. The first lower electrode 311 and the second lower electrode 312 may include a high reflective material. For example, the first lower electrode 311 and the second lower electrode 312 may include a metal, such as aluminum (Al) and silver (Ag). The second lower electrode 312 may include a same material as the first lower electrode 311. The first lower electrode 311 may be a multi-layer structure. For example, the first lower electrode 311 may be a structure including a reflective electrode having a high-reflective material between transparent electrodes having a transparent conductive material, such as indium tin oxide (ITO) and indium zinc oxide (IZO). The structure of the second lower electrode 312 may be same as the structure of the first lower electrode 311. For example, the second lower electrode 312 may be a multi-layer structure.

The first light-emitting layer 321 may generate light, the brightness of which corresponds to the voltage difference between the first lower electrode 311 and the first upper electrode 331. The second light-emitting layer 322 may generate light, the brightness of which corresponds to the voltage difference between the second lower electrode 312 and the second upper electrode 332. For example, the first light-emitting layer 321 and the second light-emitting layer 322 may include an emitting material layer (EML) having an emission material. The emission material may be an organic material, an inorganic material, or a hybrid material. For example, the display device may be an organic light-emitting display device including an organic light-emitting layer.

The first light-emitting layer 321 and the second light-emitting layer 322 may be a multi-layer structure in order to increase luminous efficacy. For example, the first light-emitting layer 321 and the second light-emitting layer 322 may further include at least one of a hole injection layer (HIL), a hole transporting layer (HTL), an electron transporting layer (ETL), and an electron injection layer (EIL).

The second light-emitting layer 322 may include the same material as the first light-emitting layer 321. For example, the second light-emitting layer 322 may be connected to the first light-emitting layer 321. A space between the first lower electrode 311 and the second lower electrode 312 which are separated on the lower passivation 110 may be filled by the first light-emitting layer 321 and the second light-emitting layer 322.

In the display device, the light-emitting structures 300R, 300B, 300G and 300W on each sub-pixel area REA, BEA, GEA and WEA may display a same color. For example, the display device may include the light-emitting structures 300R, 300B, 300G and 300W displaying a white color. In the display device, the second light-emitting layer 312 of the light-emitting structures 300R, 300B, 300G and 300W may be coupled with the first light-emitting layer 311 of the corresponding light-emitting structure 300R, 300B, 300G and 300W.

The first upper electrode 331 and the second upper electrode 332 may include a conductive material. The first upper electrode 331 and the second upper electrode 332 may include a material different from the first lower electrode 311 and the second lower electrode 312, respectively. For example, the first upper electrode 331 and the second upper electrode 332 may be a transparent electrode. Thus, in the display device, the light generated by the first light-emitting layer 321 and the second light-emitting layer 322 may be emitted thought the first upper electrode 331 and the second upper electrode 332.

The first upper electrode 331 and the second upper electrode 332 may extend along the first light-emitting layer 321 and the second light-emitting layer 322. For example, the second upper electrode 332 of the light-emitting structures 300R, 300B, 300G and 300W may be connected to the first upper electrode 331 of the corresponding light-emitting structure 300R, 300B, 300G and 300W.

The color filters 400R, 400B and 400G may convert the light generated by the light-emitting structures 300R, 300B, 300G and 300W to a specific color. The color filters 400R, 400B and 400G may overlap the corresponding sub-pixel area REA, BEA, GEA and WEA. For example, the color filters 400R, 400B and 400G may include a red color filter 400R overlapping with the red sub-pixel area REA, a blue color filter 400B overlapping with the blue sub-pixel area BEA, and a green color filter 400G overlapping with the green sub-pixel area GEA.

The color filters 400R, 400B and 400G may be disposed in a space between the first light-emitting structure 301R, 301B, 301G and 301W and the second light-emitting structure 302R, 302B, 302G and 302W of each the light-emitting structure 300R, 300B, 300G and 300W. For example, the red color filter 400R may fill a space between the first light-emitting structure 301R and the second light-emitting structure 302R of the red light-emitting structure 300R. Thus, in the display device, the light leakage may be reduced.

The display device may further comprise an upper passivation layer 130 on the light-emitting structures 300R, 300B, 300G and 300W. A damage of the light-emitting structures 300R, 300B, 300G and 300W due to the moisture permeation and the impact may be reduced. The upper passivation layer 130 may include an insulating material. For example, the upper passivation layer 130 may include silicon oxide and/or silicon nitride. The upper passivation layer 130 may be a multi-layer structure.

The display device may further comprise an upper substrate 500 on the upper passivation layer 130. The upper substrate 500 may be opposite to the lower substrate 100. The upper substrate 500 may include an insulating material. The upper substrate 500 may include a transparent material. For example, the upper substrate 500 may include glass or plastic.

A black matrix 610 may be disposed on the upper substrate 500. The black matrix 610 may overlap the non-emitting area NEA of the lower substrate 100. A lower surface of the black matrix 610 may face the upper surface of the inclined insulating layer 120.

The display device may further comprise a filler 700 filling a space between the lower substrate 100 and the upper substrate 500. The filler 700 may prevent a damage of the light-emitting structure 300R, 300B, 300G and 300W due to an external impact. For example, the filler 700 may extend between the light-emitting structures 300R, 300B, 300G and 300W and the black matrix 610.

Accordingly, in the display device, the light-emitting structure on the single sub-pixel area may be separated into a first light-emitting structure and a second light-emitting structure which are slantingly disposed with respect to the lower substrate. Also, in the display device, the light generated by the first light emitting structure may be symmetrically disposed, so that the light generated by the two light-emitting structures on the single sub-pixel area may be focused on the corresponding sub-pixel area. Thus, in the display device, the reduction of the emission area by the repair process may be prevented, and the emission efficiency may be improved.

Figure 3:
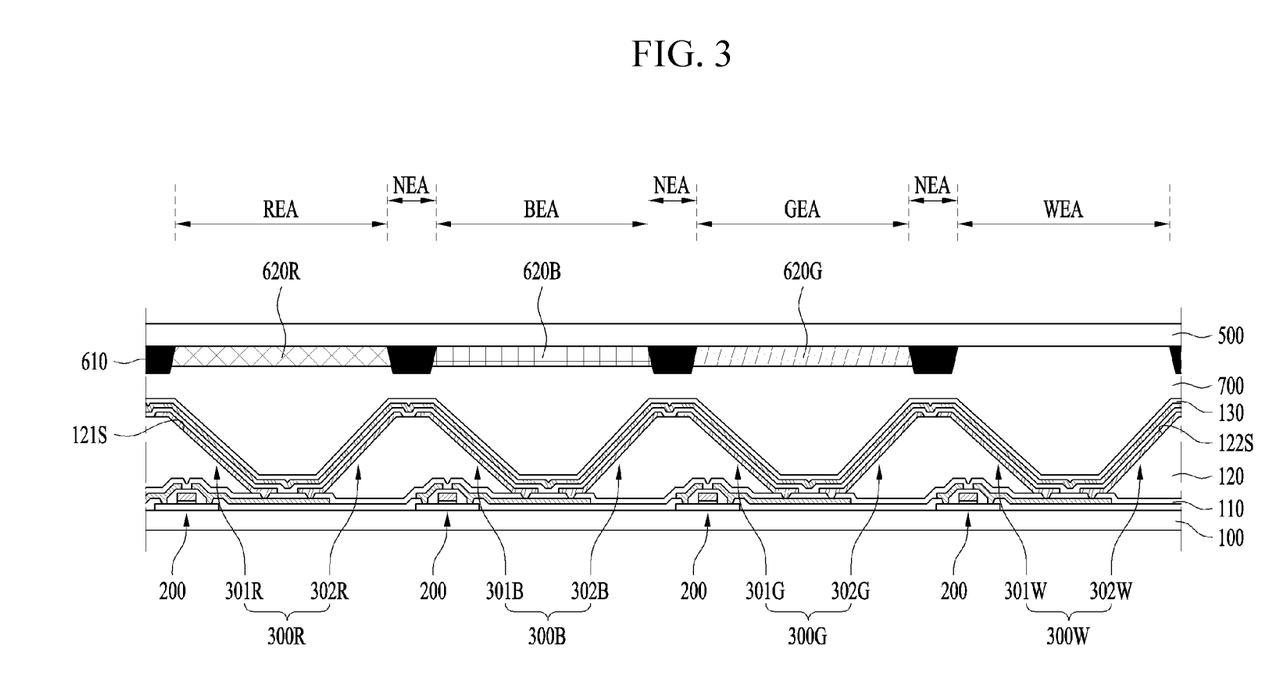
FIGS. 3 to 6, 8 and 9 are views, respectively, showing various examples of a display device according to various embodiment.

The display device is described such that the color filters 400R, 400B and 400G fill a space between the first light-emitting structure 301R, 301B, 301G and 301W and the second light-emitting structure 302R, 302B, 302G and 302W of each light-emitting structure 300R, 300B, 300G and 300W. However, the display device according to another embodiment may include color filters 620R, 620B and 620G between the black matrix 610 of the upper substrate 500, as shown in FIG. 3. In the display device according to another embodiment, a vertical thickness of the black matrix 610 may be larger than a vertical thickness of the color filters 620R, 620B and 620G. Thus, in the display device according to another embodiment, a damage of the light-emitting structure 300R, 300B, 300G and 300W due to a forming process of the color filters 620R, 620B and 620G may be prevented, and the light leakage may be efficiently reduced.

Figure 4:
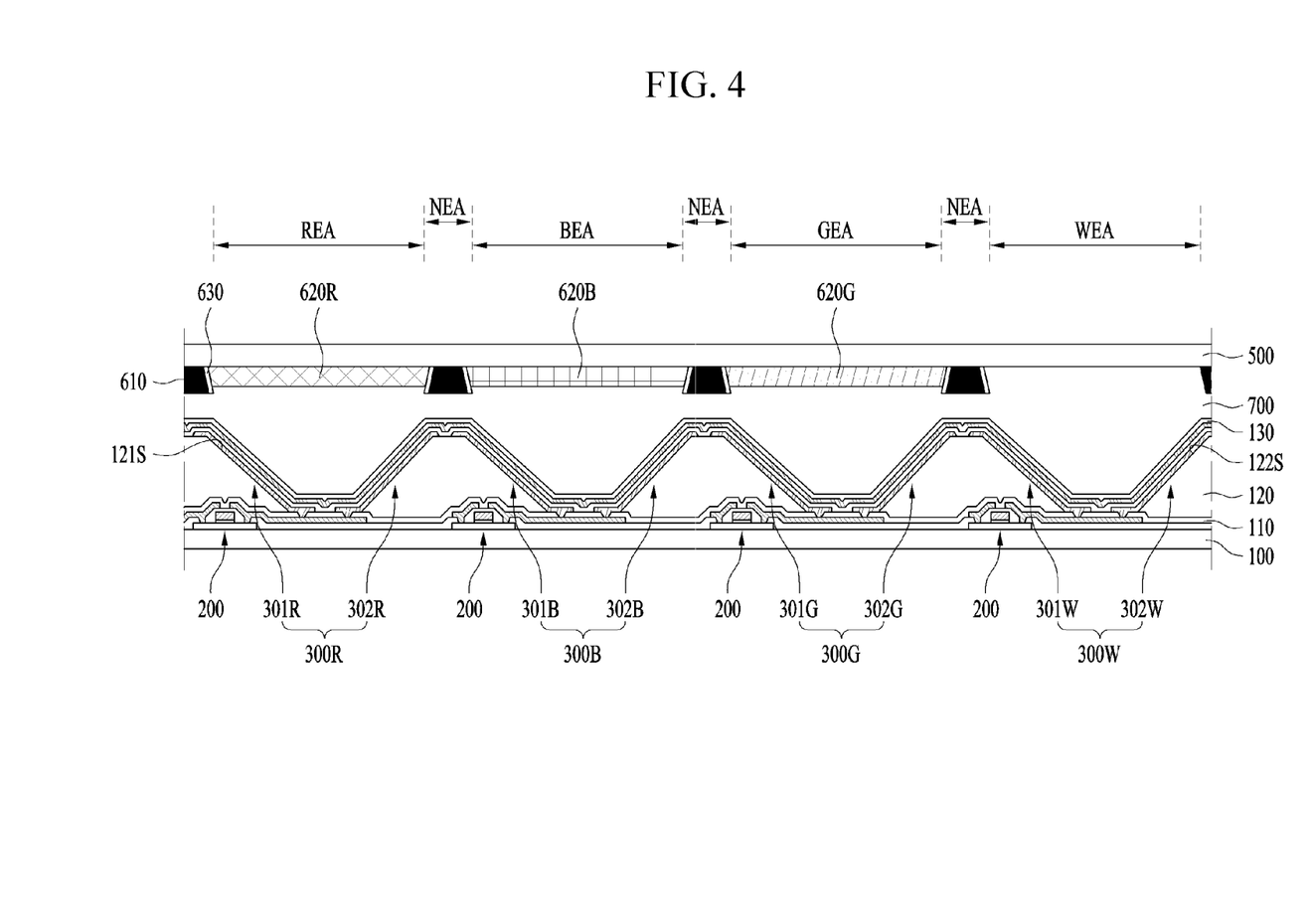

The display device according to another embodiment is described that a side of the black matrix may be positively tapered. However, the display device according to further another embodiment may include a black matrix 610 having a side which is negatively tapered, as shown in FIG. 4. Also, the display device according to further another embodiment may further include a reflective pattern 630 on the side of the black matrix which is negatively tapered. Thus, in the display device according to further another embodiment, the light which travels toward the black matrix may be emitted in an external direction by the reflective pattern. Therefore, in the display device according to further another embodiment, the light leakage may be reduced, and the emission efficiency may be efficiently improved.

Figure 5:
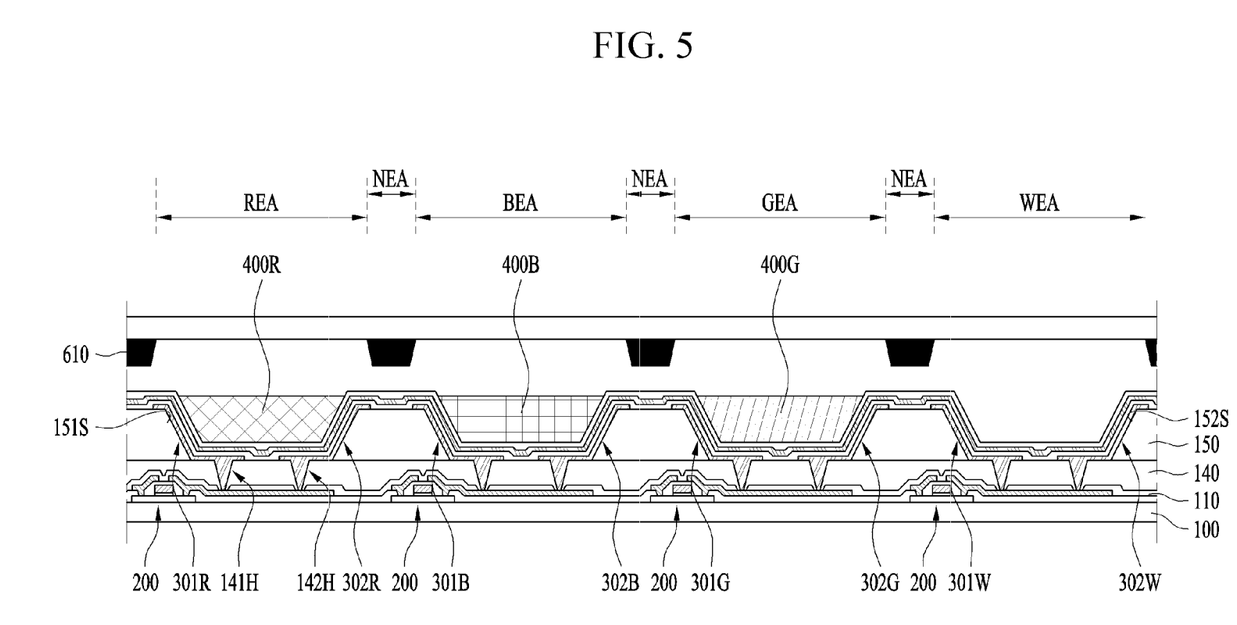

The display device is described such that the inclined insulating layer 120 is disposed on the lower passivation layer 110. However, the display device according to another embodiment may include an over-coat layer 140 and inclined insulating layers 150 which are sequentially stacked on the lower passivation layer 110, as shown in FIG. 5. An upper surface of the over-coat layer 140 may be parallel with the surface of the lower substrate 100. The over-coat layer 140 may extend to the outside of the inclined insulating layers 150. For example, the over-coat layer 140 may include a first penetrating hole 141H and a second penetrating hole 142H which respectively expose a portion of the thin film transistor 200.

Figure 6:
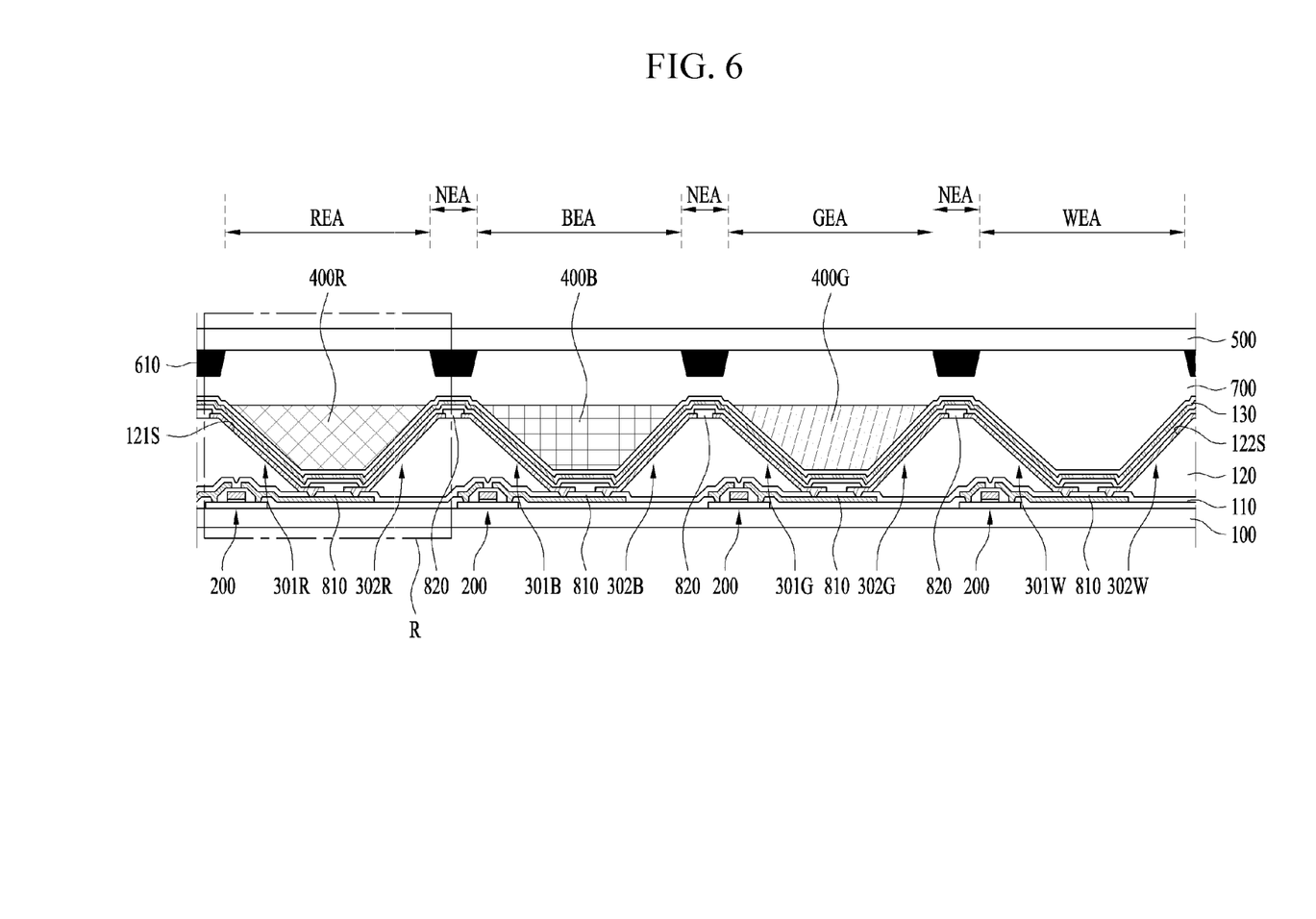
Figure 7:
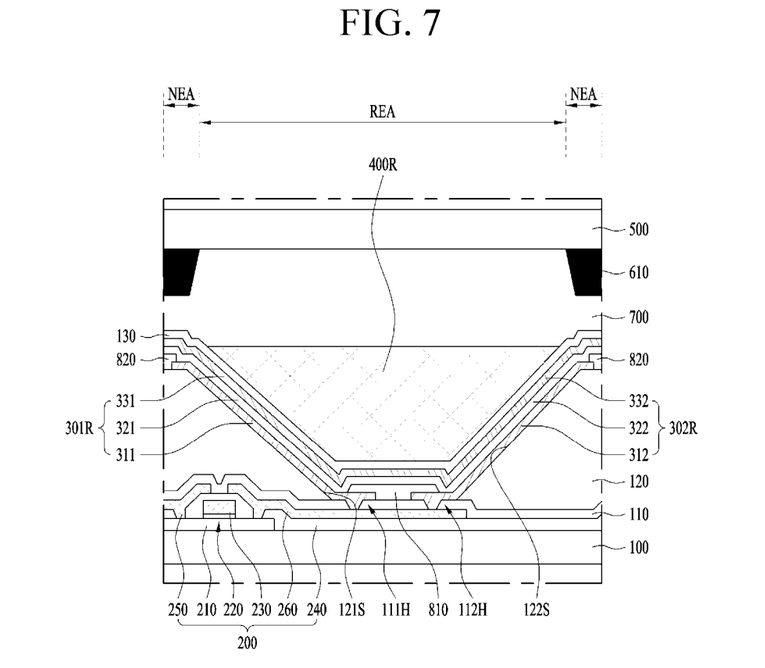
FIG. 7 is an enlarge view of region R in FIG. 6.

The display device is described such that the edge of the first lower electrode 311 and the edge of the second lower electrode 312 is covered by the first light-emitting layer 321 and the second light-emitting layer 322. However, the display device according to another embodiment may include a first bank insulating layer 810 covering end portions of the first lower electrode 311 and the second lower electrode 312 which are disposed near the lower passivation layer 110, and a second bank insulating layer 820 covering end portions of the first lower electrode 311 and the second lower electrode 312 on the upper surface of the inclined insulating layers 120, as shown in FIGS. 6 and 7. Thus, in the display device according to another embodiment, the second lower electrode 312 may be enough insulated from the adjacent first lower electrodes 311.

Figure 8:
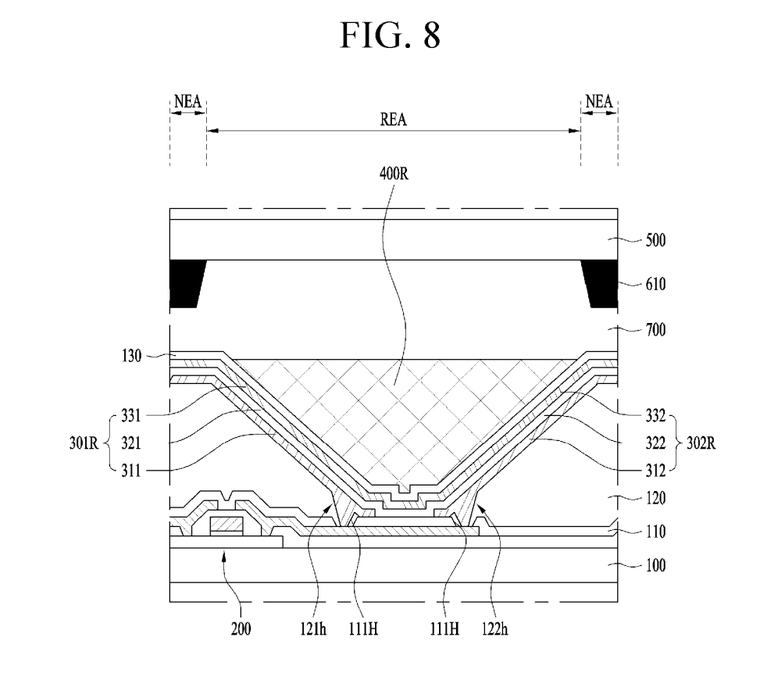

The display device is described such that the first contact hole 111H and the second contact hole 112H of the lower passivation layer 110 exposing the drain electrode of the corresponding thin film transistor 200 is disposed between the adjacent inclined insulating layers 120. However, the display device according to another embodiment may comprise a lower passivation layer 110 including a first contact hole 111H and a second contact hole 112H which overlap the inclined insulating layers 120, as shown in FIG. 8. In the display device according to another embodiment, the inclined insulating layers 120 may include a first via hole 121H vertically aligned with the first contact hole 111H, and a second via hole 122H vertically aligned with the second contact hole 112H. Thus, in the display device, the degree of freedom for location of the first contact hole 111H and the second contact hole 112H of the lower passivation layer 110 may be increased.

Figure 9:
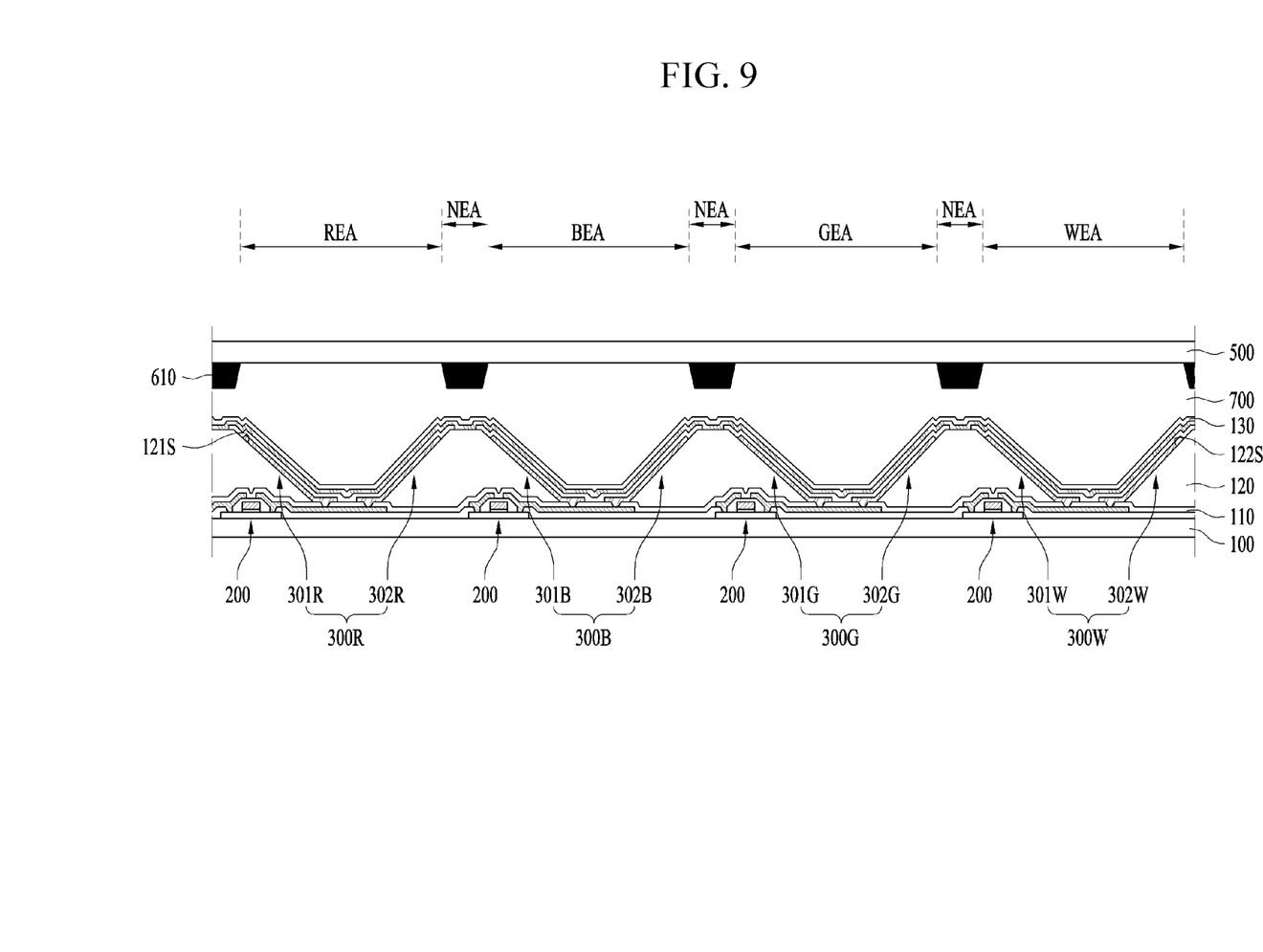

The display device is described such that the light-emitting structure 300R, 300B, 300G and 300W displays a same color, and each of the sub-pixel areas REA, BEA, GEA and WEA realizes a corresponding color using the color filters 400R, 400B and 400G. However, the display device according to another embodiment may include light-emitting structures 300R, 300B, 300G and 300W which respectively has a light-emitting layer separated from the adjacent light-emitting structures 300R, 300B, 300G and 300W, as shown in FIG. 9. For, example, each of the light-emitting structure 300R, 300B, 300G and 300W may display a different color from each other. Thus, the display device may not use color filter.

The display device may include two light-emitting structures disposed on a single sub-pixel area and inclined with respect to a lower substrate to focusing the light emitted by the two light-emitting structures. Thus, in the display device, when one of the light-emitting structures on a single sub-pixel area includes a dark spot due to a repair process or becomes unusable, the emitting area of the single sub-pixel area may be not reduced. Therefore, in the display device, the emission efficiency may be improved.

What is claimed is:
1. A display device comprising:
a lower substrate including a sub-pixel area for producing a specific color;
a first light-emitting structure on the sub-pixel area of the lower substrate, the first light-emitting structure includ- ing a first lower electrode inclined with respect to the lower substrate, a first light-emitting layer and a first upper electrode, which are sequentially stacked; and a second light-emitting structure on the sub-pixel area of the lower substrate, the second light-emitting structure including a second lower electrode inclined with respect to the lower substrate, a second light-emitting layer and a second upper electrode, which are sequentially stacked, wherein at least a portion of the second light-emitting structure is inclined in an opposite direction relative to at least a portion of the first light-emitting structure with respect to the sub-pixel area of the lower substrate.

2. The display device according to claim 1, wherein a distance between the lower substrate and an upper surface of the first lower electrode decreases towards a center of the sub-pixel area, and a distance between the lower substrate and an upper surface of the second lower electrode decreases toward the center of the sub-pixel area.

3. The display device according to claim 1, further comprising a thin film transistor between the lower substrate and the first light-emitting structure, wherein the thin film transistor includes a drain electrode electrically connected to the first lower electrode and the second lower electrode.

4. The display device according to claim 3, further comprising a lower passivation layer covering the thin-film transistor, the lower passivation layer including a first contact hole and a second contact hole which respectively expose the drain electrode, and wherein the first lower electrode and the second lower electrode are in direct contact with the lower passivation layer.

5. The display device according to claim 3, wherein the second light-emitting layer includes a same material as the first light-emitting layer.

6. The display device according to claim 5, wherein the second light-emitting layer is connected to the first light-emitting layer, and wherein the second upper electrode is connected to the first upper electrode.

7. The display device according to claim 5, further comprising a color filter on the first light-emitting structure, the color filter extending onto the second light-emitting structure.

8. The display device according to claim 1, further comprising a first bank insulating layer covering one edge of the first lower electrode and a second bank insulating layer covering another edge of the first lower electrode.

9. A display device comprising:
a first inclined insulating layer on a lower substrate including a first inclined side which is positively tapered,
a second inclined insulating layer on the lower substrate including a second inclined side which is positively tapered, the second inclined insulating layer adjacent to the first inclined insulating layer;
a first light-emitting structure on the first inclined side, the first light-emitting structure defined by a sequential stack of a first lower electrode, a first light-emitting layer and a first upper electrode; and
a second light-emitting structure on the second inclined side, the second light-emitting structure in conjunction with the first light-emitting structure forming a well, the second light-emitting structure defined by a sequential stack of a second lower electrode spaced apart from the first light-emitting structure, a second light-emitting layer and a second upper electrode.

10. The display device according to claim 9, wherein a width of the well decreases towards the lower substrate.

11. The display device according to claim 9, further comprising a black matrix on an upper substrate opposite the lower substrate, the black matrix contacting with a side of a color filter above the well,
wherein a side of the black matrix is negatively tapered.

12. The display device according to claim 11, wherein a vertical thickness of the black matrix is larger than a vertical thickness of the color filter.

13. The display device according to claim 11, further comprising a reflective pattern on a side of the black matrix.

14. The display device according to claim 9, wherein the color filter is in the well.

15. A display device comprising:
a lower substrate including a sub-pixel area for producing a specific color;
a thin film transistor (TFT) including a semiconductor pattern, a gate insulating layer, a gate electrode, a source electrode, and a drain electrode, the TFT disposed on an upper surface of the lower substrate within the sub-pixel area;
a first lower electrode coupled to the drain electrode of the TFT, at least a portion of an upper surface of the first lower electrode slanted in a direction with respect to the lower substrate;
a second lower electrode coupled to the drain electrode of the TFT, at least a portion of an upper surface of the second lower electrode slanted in an opposite direction than the upper surface of the first lower electrode; and
a light emitting layer on the first lower electrode and the second lower electrode for emitting light responsive to providing current from the TFT to the light emitting layer via the first lower electrode and the second lower electrode.

16. The display device according to claim 15, wherein the upper surface of the first lower electrode and the upper surface of the second lower electrode are symmetric.

17. The display device according to claim 15, wherein the light-emitting layer comprises a first segment on the first lower electrode and slanted in a same direction as the first lower electrode, and a second segment on the second lower electrode and slanted in a same direction as the second lower electrode,
wherein a portion of the light-emitting layer closer to a center of the sub-pixel area is closer to the upper surface of the lower substrate than a portion of the light-emitting layer closer to an edge of the sub-pixel area.

18. The display device according to claim 15, further comprising:
an insulator between the TFT and the first lower electrode, the first lower electrode on an upper surface of the insulator, the upper surface of the insulator slanted in the same direction as the first lower electrode.

19. The display device according to claim 15, further comprising a first bank insulating layer covering one edge of the first lower electrode and a second bank insulating layer covering another edge of the first lower electrode.

20. The display device according to claim 19, wherein the first bank insulating layer is closer to the upper surface of the lower substrate than the second bank insulating layer.

* * * * *